(12) United States Patent
Pavao-Moreira et al.

(10) Patent No.: US 9,379,721 B2
(45) Date of Patent: Jun. 28, 2016

(54) CAPACITIVE ARRANGEMENT FOR FREQUENCY SYNTHESIZERS

(75) Inventors: Cristian Pavao-Moreira, Frouzins (FR); Dominique Delbecq, Fonsorbes (FR); Jean-Stephane Vigier, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/410,153

(22) PCT Filed: Jul. 6, 2012

(86) PCT No.: PCT/IB2012/001562
§ 371 (c)(1),
(2), (4) Date: Dec. 22, 2014

(87) PCT Pub. No.: WO2014/006439
PCT Pub. Date: Jan. 9, 2014

(65) Prior Publication Data
US 2015/0326235 A1 Nov. 12, 2015

(51) Int. Cl.
*H03B 5/12* (2006.01)
*H03L 7/099* (2006.01)
(Continued)

(52) U.S. Cl.
CPC ............... *H03L 7/0997* (2013.01); *H03B 1/00* (2013.01); *H03B 5/08* (2013.01); *H03B 5/1215* (2013.01);
(Continued)

(58) Field of Classification Search
CPC .......... H03C 3/09; H03B 5/12; H03B 5/1265; H03B 5/1215; H03B 5/1228; H03B 5/08; H03B 1/00; H03K 3/0315; H03L 7/0997; H03L 7/0995; H03L 7/18; H03L 7/099

USPC ............... 331/167, 177 V, 36 C, 179, 117 FE
See application file for complete search history.

(56) References Cited

U.S. PATENT DOCUMENTS 6,791,422 B2  9/2004 Staszewski et al.
7,772,929 B2  8/2010 Da Dalt
(Continued)

FOREIGN PATENT DOCUMENTS

EP  2434639 A1  3/2012

OTHER PUBLICATIONS

Xuan Dai et al: "Frequency Resolution Enhancement for Digitally Controlled Oscillators Using Series Switched Varactor", Integrated Circuits, ISIC '09, Proceedings of the 2009 12th International Symposium on, IEEE, Piscataway, NJ, USA, Dec. 14, 2009, pp. 397-400.
International Search Report and Written Opinion correlating to PCT/IB2012/001562 dated May 3, 2013.

*Primary Examiner* — Arnold Kinkead
(74) *Attorney, Agent, or Firm* — Charlene R. Jacobsen

(57) ABSTRACT

An electronic device has a capacitive arrangement for controlling a frequency characteristic. The capacitive arrangement has varactor banks having a number of parallel coupled varactors and a control input for switching the respective varactors on or off. A main varactor bank has N varactors and a series varactor bank has A varactors, the main varactor bank being connected in series with the series varactor bank. A shunt varactor bank of B varactors may be coupled to a ground reference and connected between the main varactor bank and the series varactor bank. When a varactor is switched in the main varactor bank, it provides an equivalent capacitance step size (or frequency step) smaller than size of a capacitance step when switching a single varactor on or off. According to the number of varactors selected in the shunt varactor, B, this frequency step can be made programmable. By the arrangement of unitary varactors a very small step size is achieved for providing a high resolution of frequency of a digitally controlled oscillator.

20 Claims, 5 Drawing Sheets

(51) Int. Cl.
  *H03L 7/18* (2006.01)
  *H03B 1/00* (2006.01)
  *H03B 5/08* (2006.01)
  *H03K 3/03* (2006.01)

(52) U.S. Cl.
  CPC ............ *H03B 5/1228* (2013.01); *H03B 5/1265* (2013.01); *H03L 7/099* (2013.01); *H03L 7/0995* (2013.01); *H03L 7/18* (2013.01); *H03K 3/0315* (2013.01)

(56) References Cited

U.S. PATENT DOCUMENTS

| | | | |
|---|---|---|---|
| 7,782,152 B2* | 8/2010 | Darabi | H03L 1/00 331/158 |
| 2008/0036550 A1* | 2/2008 | Yu | H03B 5/1228 331/179 |
| 2008/0129398 A1 | 6/2008 | Sun et al. | |
| 2009/0085681 A1 | 4/2009 | Lin et al. | |

\* cited by examiner

CAPACITIVE ARRANGEMENT FOR FREQUENCY SYNTHESIZERS

FIELD OF THE INVENTION

This invention relates to electronic devices having a capacitive arrangement for controlling a frequency characteristic of a circuit by modifying the equivalent capacitance of the capacitive arrangement. More specifically, the invention is in the field of frequency synthesizers and digitally controlled oscillators comprising the capacitive arrangement.

BACKGROUND OF THE INVENTION

United States patent application US 2008/0129398 describes designs for a digitally controlled oscillator (DCO) for replacing conventional voltage controlled oscillators (VCOs). The DCO comprises an array of switchable capacitive elements, for example varactors, constituting a capacitive arrangement. The capacitive arrangement determines the frequency of the DCO, and has a large number of switchable capacitive elements, each element enabling a frequency step in an HF frequency synthesizer, e.g. having steps of 4 kHz.

A problem of the device known from US 2008/0129398 is that for each step an additional switchable capacitive element is needed, for example 4096 elements for a required modulation range.

SUMMARY OF THE INVENTION

The present invention provides an electronic device, and a method, as described in the accompanying claims.

Specific embodiments of the invention are set forth in the dependent claims. Aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
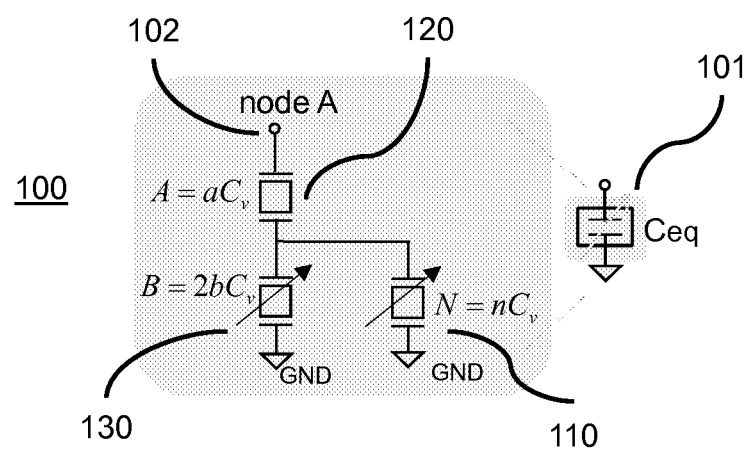
FIG. 1 shows a single ended example of a capacitive arrangement for an electronic device.
Figure 1:
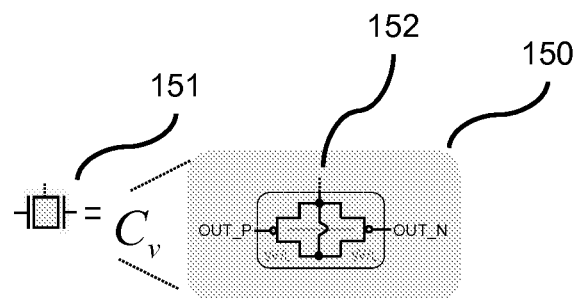

FIG. 1 shows a single ended example of a capacitive arrangement for an electronic device. The arrangement 100 is for controlling a frequency characteristic of a circuit by modifying the equivalent capacitance of the capacitive arrangement in very small and programmable steps. The capacitive arrangement has varactor banks 110,120,130 coupled to an input terminal 102 (called node A) of the capacitive arrangement. Each varactor bank has a number of parallel coupled varactors and a control input for modifying the equivalent capacitance 101 of the varactor bank by switching the respective varactors on or off.

The lower part of FIG. 1 shows an example of a varactor. The varactor 150 may be coupled in parallel to other similar varactors to constitute a varactor bank and is shown in the further Figures as a symbol 151 and/or the characters $C_v$. A varactor bank may be designated by indicating the number of varactor by an integer constant, for example $aC_v$, with "a" an integer.

As such, the varactor is a well-known element in electronic circuits, in particular in integrated circuits that contain a multitude of electronic components in semiconductor technology. Varactors are used as voltage-controlled capacitors. They are commonly used in parametric amplifiers, parametric oscillators and voltage-controlled oscillators as part of phase-locked loops and frequency synthesizers. For example, varactors are used in the tuners of television sets to electronically tune the receiver to different stations. Varactors are operated reverse-biased so no current flows, but since the thickness of the depletion zone varies with the applied bias voltage, the capacitance of the diode can be made to vary. Generally, the depletion region thickness is proportional to the square root of the applied voltage; and capacitance is inversely proportional to the depletion region thickness. Thus, the capacitance is inversely proportional to the square root of applied voltage. In the example of the varactor the depletion layer is formed by a MOS device. But the depletion layer can also be made of a p-n-junction or a Schottky diode.

In the Figure the varactor unit is shown as a PMOS-based device placed between positive (out_p) and negative (out_n) output nodes of the VCO. Unit varactor value ($C_v$) depends on the dimensions of the PMOS transistor (W,L), and its smallest size is set by the smallest device size available in the used integration technology.

The capacitive arrangement as shown in the upper part of FIG. 1 has a main varactor bank 110 of N varactors, indicated by $nC_v$ and a series varactor bank 120 of A varactors, indicated by $aC_v$. N and A are integers. The main varactor bank is connected in series with the series varactor bank. In the example the other end of the main varactor bank $C_v$ is coupled to a ground reference (GND). It is noted that such ground reference may be any signal line that is effectively a ground level for high frequencies, e.g. a supply terminal like Vdd. For example, the varactor banks may alternatively be coupled between the input terminal and Vdd.

By connecting the main varactor bank and the series varactor bank in series, the change in the equivalent capacitance 101 by switching a single varactor is smaller than a nominal change in capacitance of a separate varactor bank by such switching. If the number of varactors A is substantially equal to N, then said change is about 50% of the nominal change.

The capacitive arrangement may have a shunt varactor bank of B varactors, indicated as $2bCv$, B being an integer. The shunt varactor bank has one terminal coupled to a ground reference (GND) and the other terminal connected between the main varactor bank and the series varactor bank. The specific change step of various capacitive arrangements is described in detail below.

The varactors banks are arranged to provide a very low equivalent capacitance, indicated as $C_{eq}$, between a given node (node A) of the circuit and a reference (ground or supply). $C_{eq}$ is given by following expression:

$$C_{eq} = \frac{aC_v \times (n + 2b)}{a + n + 2b}$$

And the effect of change the equivalent capacitance ($\Delta\_Ceq$) when switching on a varactor within the main varactor bank is given by:

$$\Delta C_{eq} = \frac{a^2 C_v^2}{(a + n + 2b)^2} \times \Delta C_v$$

In practical examples the following values can be achieved:
Switching unit varactor Cv=200 to 400 aF ($\Delta$Cv=200 aF), a=100, b=100, b'=200

$\Delta\_Ceq(b=100)=22aF$ $\Delta\_Ceq(b'=200)=7.95aF$

Switching unit varactor Cv=200 to 400 aF ($\Delta$Cv=200 aF), a=10, b=100, b'=200

$\Delta\_Ceq(b=100)=0.45aF$ $\Delta\_Ceq(b'=200)=0.12aF$

Figure 2:
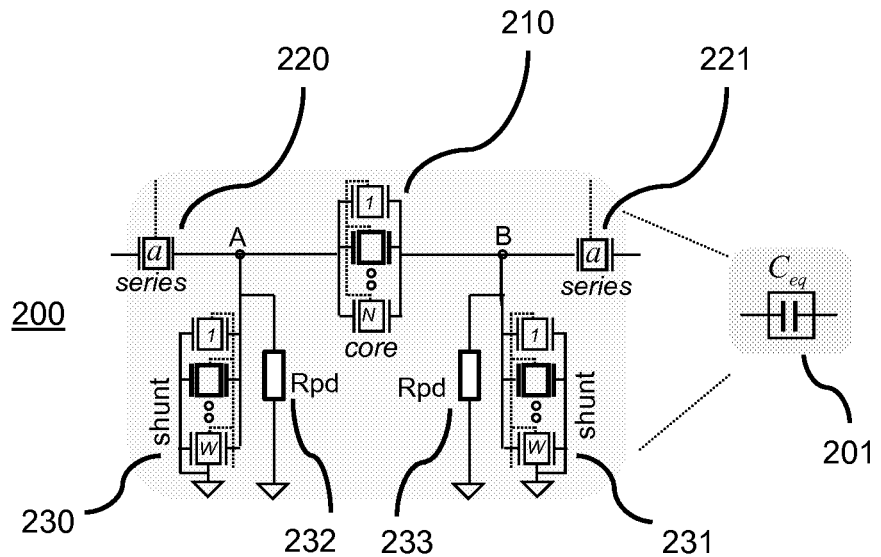
FIG. 2 shows a differential example of a capacitive arrangement for an electronic device.
Figure 2:
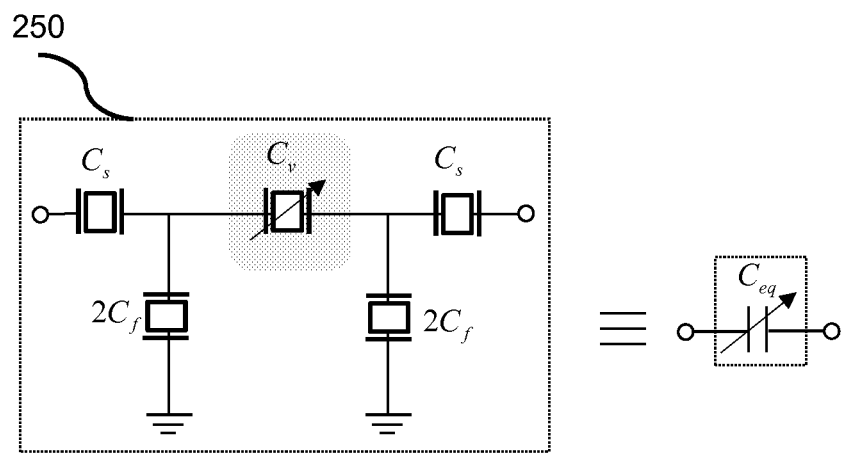

FIG. 2 shows a differential example of a capacitive arrangement for an electronic device. The arrangement 200 is for controlling a frequency characteristic of a circuit by modifying the equivalent capacitance 201 of the capacitive arrangement in very small and programmable steps. The capacitive arrangement has varactor banks 210, 220, 230 coupled to both input terminals of the capacitive arrangement. The elements are shown as an equivalent capacitive arrangement 250 in the lower part of FIG. 2. The actual varactor banks are shown in the upper part of FIG. 2.

A main varactor bank 210, having N parallel varactors $C_v$ is named "core" and is coupled between nodes A and B. A series varactor bank 220 having "a" parallel varactors is named "series" and is coupled between node A and an input terminal, and is indicated in the equivalent circuit by $C_s$. A shunt varactor bank 230 is named "shunt" and is coupled between node A and a ground reference, indicated by $2C_f$.

The Figure shows a symmetrical arrangement having a further series varactor bank 221 having AA parallel varactors coupled between node B and the other input terminal, and indicated in the equivalent circuit also by $C_s$. A further shunt varactor bank 231 is named "shunt", has BB varactors and is coupled between node B and the ground reference, and also indicated by $2C_f$. Two high value resistors Rpd (232, 233) may be placed in parallel with each shunt varactor bank to provide a pull down DC level at A and B nodes. Since both resistors do not impact behaviour of capacitive arrangement, they are omitted in further embodiments for simplicity on analytical derivations.

The equivalent fully varactor based capacitive arrangement 250 has the following equivalent capacitance:

$$C_{eq} = \frac{C_s(C_v + C_f)}{2(C_v + C_f) + C_s} \quad (1)$$

The change on the equivalent capacitance between both input terminals when switching a varactor within the core varactor bank is given by:

$$\Delta C_{eq} = \frac{C_s^2}{(2C_v + 2C_f + C_s)^2} \times \Delta C_v \quad (2)$$

In the proposed embodiment, Cs and Cf are varactors or group of varactors, and both are multiple of the unit varactor Cv. In a practical example the capacitance of the proposed fully varactor based differential arrangement varies by an amount called $\Delta\_Ceq$ by switching the input control point of a varactor between two input voltage levels, i.e. a digital on/off control, originating two unit varactor values, e.g. Cv (off)=200 aF to Cv(on)=400 aF. It is noted that aF designates atto Farad, i.e. $10^{-18}$ Farad. Hence $\Delta$Cv=200 aF. The number of varactors are, a=100, b=100, b'=200, b''=400, which results, based in formula (2), in:

$\Delta\_Ceq(b=100)=21.64aF$ $\Delta\_Ceq(b'=200)=7.87aF$ $\Delta\_Ceq(b''=400)=2.44aF$ Hence a very low step in equivalent capacitance is achieved when switching 200 aF of a unit varactor. It is noted that other practical step sizes can be easily determined by selecting appropriate values for a, b, and N, with respect to the $\Delta\_Ceq$ of the used varactors.

Figure 3:
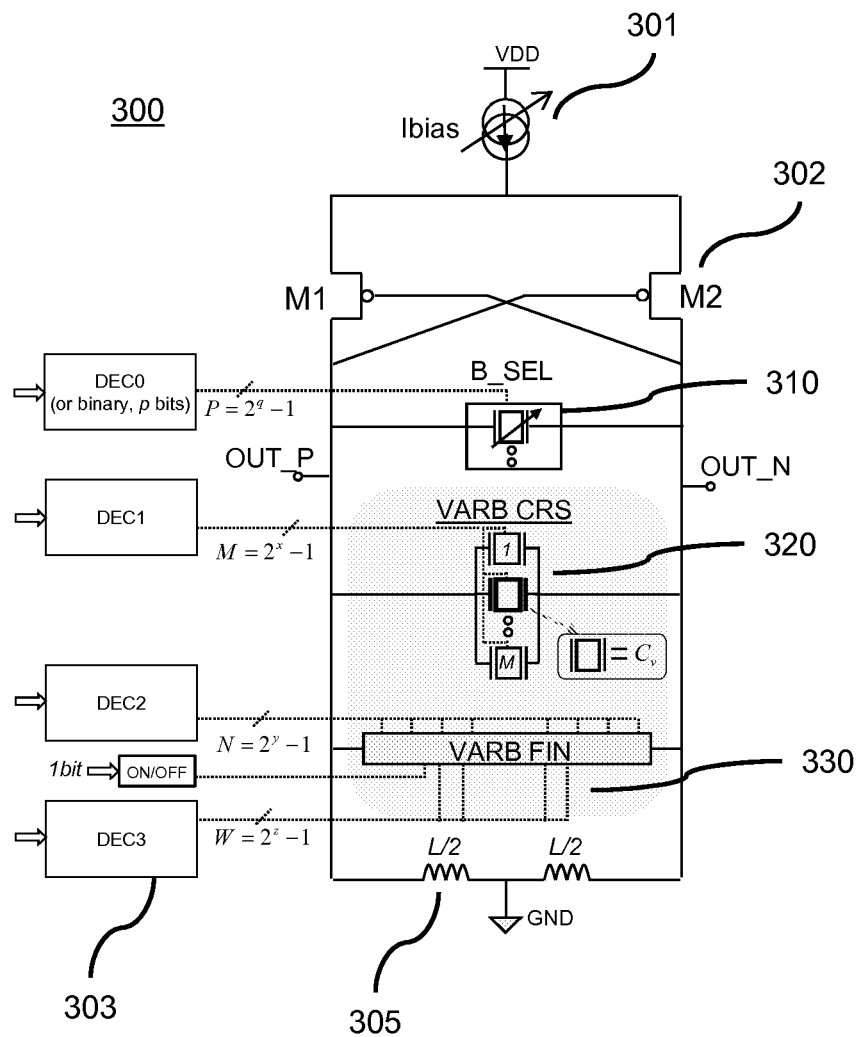
FIG. 3 shows an example of a device having an LC oscillator circuit controlled by a capacitive arrangement.

FIG. 3 shows an example of a device having an oscillator circuit controlled by a fully varactor based capacitive arrangement. The oscillator is an inductance/capacitance (LC) based voltage controlled oscillator (VCO) application, i.e. a digital controlled oscillator (DCO).

The oscillator 300 (VCO/DCO) uses the proposed fully varactor-based arrangement and has a programmable current source (Ibias) 301, of which the current value is set to the minimum current that guarantees VCO/DCO oscillation condition. A pair 302 of cross-coupled PMOS transistors, M1/M2, provides a negative resistance to a LC circuit comprising coils 305 and the capacitive arrangement (also called LC tank), for generating the oscillation.

A digitally-controlled band selection varactor bank B_SEL 310 may be used for compensating process variation and enabling frequency trimming to a preferred operation range (band select) according to an input control. A specific binary-to-thermometric decoder DEC0 may also be used in order to select a group of varactors inside the band selection varactor bank. DEC0 having P input bits meaning P=$2^q$−1 outputs for controlling the B_SEL varactor bank. This decoder may be replaced in some applications by a p bits binary weighted control.

The inductor L 305 has a center-tapped structure, the center tap being coupled to a ground reference (GND), and a fully varactor-based capacitive arrangement (coarse VARB_CRS+ fine VARB_FIN) is used as an input port, e.g. in PLL using a two-port modulation scheme.

The capacitive arrangement is controlled via a control circuit 303 of decoders coupled respective input terminals of the varactor banks. The decoders, for example, convert a binary input to a thermometric set of control outputs to be coupled to the varactors of a bank; a first decoder DEC1 having X input bits and M=$2^X$−1 outputs for controlling the coarse varactor bank 320; a second decoder DEC2 having Y input bits and N=$2^Y$−1 outputs for controlling the main varactor bank in the fine varactor bank 330; and a third decoder DEC3 having Z input bits and W=$2^Z$−1 outputs for controlling the shunt varactor bank in the fine varactor bank 330. A further part of the control circuit called ON/OFF controls the series varactor bank in the fine varactor bank 330.

In a practical example DEC1 (COARSE) is a binary to thermo decoder to select the number of coarse varactors needed to obtain an oscillation frequency close to the required. DEC2 (FINE) is a binary to thermo decoder used to dynamically set (during VCO calibration) the number of varactors needed to obtain exactly, within a certain error range, the required frequency. This code_fine (N) value may be determined before each transmission, and for each sample. The frequency step size, i.e. resolution, is programmable by means of DEC3 and ON/OFF decoders. DEC3 is a binary to thermo decoder that allows fine tuning (statically) the available frequency resolution. ON/OFF is a one bit control to statically switch on/off varactors inside the two identical series varactor banks (aCv). This enables an additional coarse setting of the frequency resolution. The ON/OFF bit shall be set before running the band selection calibration of the VCO, since switching of the series bank affects the VCO centre frequency because the series capacitance is directly loading the VCO output nodes.

The above fully varactor-based arrangement is composed by a coarse varactor bank with 1 to M identical varactors (Cv), and a fine varactor bank 330 similar to the structure shown in FIG. 2.

The coarse varactor bank is a bank of 1 to M identical unit varactors (Cv) driven by a thermometric set of control signals. Thereby 1 to M varactors can be selected to obtain a given coarse frequency step as required by a modulation scheme used, as described later with reference to FIG. 4.

The fine varactor bank arrangement is a fully varactor-based capacitive divider and has a main varactor bank (nCv) in parallel with two shunt varactor banks (2bCv), further series connected to two series varactor banks (aCv). By switching one varactor unit of size Cv of the main varactor bank at a time, an equivalent capacitance step is created between the differential outputs nodes of the VCO, enabling achieving a required frequency resolution. The shunt (2bCv) and series (aCv) varactor banks are both controllable, enabling a further tuning of the achievable frequency resolution. It is noted that, in the series and/or shunt varactor banks, a number of varactors may be grouped, and controlled via one group input per group.

In a practical circuit, the capacitive arrangement is a varactor-based capacitive divider placed between VCO positive and negative output nodes (OUT_P, OUT_N). The fine varactor bank provides extremely small equivalent capacitance steps, ΔCeq, i.e., very small frequency steps, needed to exactly get the 1 MHz step (+/− error), or 500 kHz Gaussian shapped step, according to the required modulation scheme. The fine varactor bank has a "core" varactor bank connected between nodes A and B, composed by 1 to N unit varactors, identical to unit varactor (Cv) of the coarse bank. N may be selected during a VCO calibration procedure, via a dichotomy procedure. The calibration may be performed before each transmission and for each sample. The fine varactor bank has two identical "shunt" varactor banks, 2bCv, connected each one between nodes A and B and ground, each having 1 to W unit varactors, Cv. The number of unit varactors (Cv) statically activated via the DEC_RES decoder is a function of the required frequency resolution (e.g. +/−5 kHz). The higher W, the lower Fstep. It allows a fine tuning of the nominal/available fres. Finally, the fine varactor bank has two "series" varactor banks, aCv, "a" is an integer, connected between nodes A and OUT_P, and B and OUT_N. By switching on/off this varactors one can increase/decrease the frequency by large steps (coarse tuning). The higher the equivalent capacitor (by switching the varactors on), the lower Fstep.

For example, for a frequency step of 1 MHz, two codes are determined for the start frequency and the target frequency of the step. Initially the code for the start frequency is applied. Intermediate codes are applied to the coarse and fine varactor banks to accommodate the transition to the code of the target frequency. The frequency steps are obtained by successively switching off/on the varactors from 0 to Vdd voltage.

The above capacitive arrangement in the DCO may be combined with further circuitry to constitute a Digital Frequency Synthesizer. Known also as Digital Phase Locked Loop (PLL), it contains the Digital Controlled Oscillator (DCO) and other digital blocks such as a phase comparator, a divider and a frequency reference, well known as such. In a practical example of such a device the capacitive arrangement is used in such a frequency synthesizer. The synthesizer has two control ports for providing modulation scheme, a first port applies the modulation via the setting the division factor in the divider, the second port directly modulates the DCO via the control inputs of the capacitive arrangement. The frequency precision of both ports dictates the system transmitted signal integrity, and accommodates requirements depending on system specifications.

The Digital Controlled Oscillator is an oscillator of which the output frequency is not controlled by an analogue input control voltage—as in analog VCOs—but by a digital control word.

Since the DCO is controlled by a digital quantized input word, it cannot generate a continuous range of frequencies as its analogue counterpart. Wireless application standards require a very high frequency resolution to meet standard specification. In fact, in a quantized system, we may calculate the minimum required frequency resolution ($f_{RES\_MIN}$) according to equation 3, which ensures quantization is not dominating overall DCO phase noise, including some margin. $f_{REF}$ is the clock reference frequency, $\phi_{DCO}$ is the required DCO phase noise, Δf is the offset.

$$f_{RES\_MIN} = \sqrt{12 \cdot f_{REF} \cdot \Delta f^2 \cdot (\phi_{DCO} + \text{margin})} \qquad (3)$$

As the output frequency in an LC oscillator is related to a resonant circuit, as defined in equation 4, a very high frequency resolution asks for very small capacitance steps.

$$f\text{out} = 1/2\pi\sqrt{LC} \qquad (4)$$

The above fully varactor-based arrangement is able to generate the small capacitance steps, resulting in very low frequency steps, via the LC elements in the DCO. The frequency steps can be derived based on the following equations.

$$\omega_0 = \frac{1}{\sqrt{LC}} \qquad (5)$$

$$\frac{\partial \omega_0}{\partial C} = -\frac{\omega_0}{2C} \qquad (6)$$

$$\partial f_0 = \Delta f = \left| -\frac{f_0 \cdot \Delta C}{2C} \right|$$

$$f_0 = \frac{1}{2\pi\sqrt{LC}} \qquad (7)$$

Based on (5), (6) and (7) we have $$\Delta f = \frac{\Delta C}{4\pi C \sqrt{LC}} \quad (8)$$

This expression (8) shows the variation of VCO output frequency ($\Delta f$) for a given $\Delta C$ (based on a fixed resonant frequency by L,C). Based on (2) and (8) and $\Delta C = \Delta Ceq$, we have $$\Delta f = \frac{C_s^2 \times \Delta C_v}{4\pi C \sqrt{LC} \times (2C_v + 2C_f + C_s)^2} \quad (9)$$

Based on (9) practical values are determined as follows, using switching unit varactors of Cv=200 to 400 aF, and in the series varactor banks a=100, and in the shunt varactor banks of b=100, b'=200, b"=400, and a inductance of L=3 nH, and a centre frequency of fo=2.45 GHz.

$\Delta Ceq(b=100)=21.64aF \rightarrow \Delta f=18.85 kHz$ $\Delta Ceq(b=200)=7.87aF \rightarrow \Delta f=6.8 kHz$ $\Delta Ceq(b=400)=2.44aF \rightarrow \Delta f=2.13 kHz$ The capacitive arrangement has the following effects, for example when compared to existing switched capacitors. As no MOS switches are used a high quality factor Q is achieved, due to only on/off varactors in all capacitor banks. Hence the $Q_{total}$ of the DCO is optimized, without need to increase $I_{bias}$. Hence the capacitive arrangement is suited for low power applications.

Fine tuning of the frequency step (or resolution) is achieved by implementing the shunt 2bCv as a bank of varactors controlled by a thermometric decoder. Additional coarser tuning is possible by switching on/off the series aCv varactor bank, or groups of varactors in the series bank. Thereby, a high resolution in frequency is achieved in the sub kHz order, by using the novel capacitive divider structure. The high resolution enables precise frequency step during modulation, which directly improves transmitted signal integrity, for example a modulation as required by a pre-defined standard or system. Also, very low frequency steps are created in a digital PLL, which reduces quantization noise contribution from digitalizing an analog control voltage. Also, there is no need for a digital to analog converter (DAC), and no need to use a sigma-delta approximation, so no extra noise added. The on/off switching of varactors, e.g. via the control inputs and the thermometric decoders as described above, is well suited to digital PLL applications.

The capacitive arrangement and further circuitry may be implemented in an integrated circuit semiconductor device, which provides a very compact solution, and is well suited for a deep submicron process. Moreover, this fully-varactor based capacitive arrangement is robust against mismatch and process variations, since only one type of device (varactor) is used.

Figure 4:
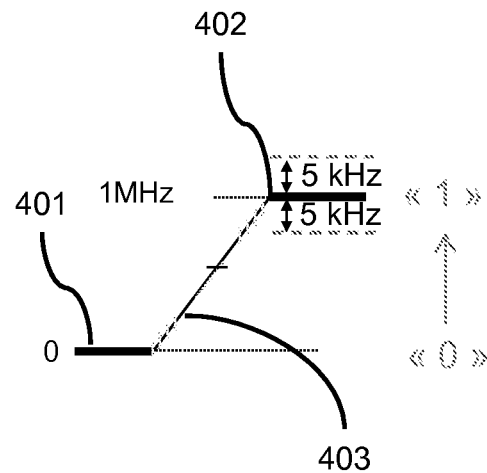
FIG. 4 shows modulation waveforms.
Figure 4:
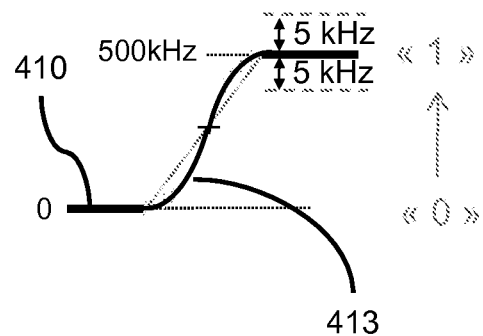

FIG. 4 shows modulation waveforms. In a first waveform 401 a digital level of "0" is represented by a first frequency, and a digital level of "1" is represented by a second frequency 402 which is 1 MHz higher. A modulation slope 403 is defined for the transition of the first to the second frequency. A accuracy of +/−5 kHz is indicated. The waveform is an example of the ZIGBEE transmission system. The VCO modulation must be in conformity with requirements in terms of frequency precision. The Zigbee Modulation Application (+/−500 kHz) defines:

a 0 to 1 MHz step in a frequency shift keying (FSK) scheme the frequency resolution, i.e. the switched capacitance, shall be small enough to obtain high precision around 1 MHz (+/−5 kHz), the precision affecting directly the system quality parameter Error Vector Magnitude (EVM).

a ramp for the transition 403, while the frequency variation from 0 to 1 MHz is done in a single step.

The lower part of FIG. 4 shows a second waveform 410. A digital level of "0" is represented by a first frequency, and a digital level of "1" is represented by a second frequency which is 500 kHz higher. A modulation gaussian shape 413 is defined for the transition of the first to the second frequency. The waveform is an example of the transmission system BTLE (Bluetooth Low Energy is a low power air interface technology defined by the Bluetooth Special Interest Group), and it is called a Gaussian Frequency Shift Keying (GFSK) scheme. The VCO modulation must be in conformity with requirements in terms of frequency precision. The BTLE Modulation (+/−250 kHz) defines:

0 to 500 kHz step for the transition.

a gaussian shaped transition when moving from 0 to 500 kHz, where all points inside slope 413 are needed to correct modulate the signal.

The proposed fully varactor-based arrangement generates very low frequency steps inside the DCO, enabling direct modulation of the DCO according to the Gaussian shape.

Figure 5:
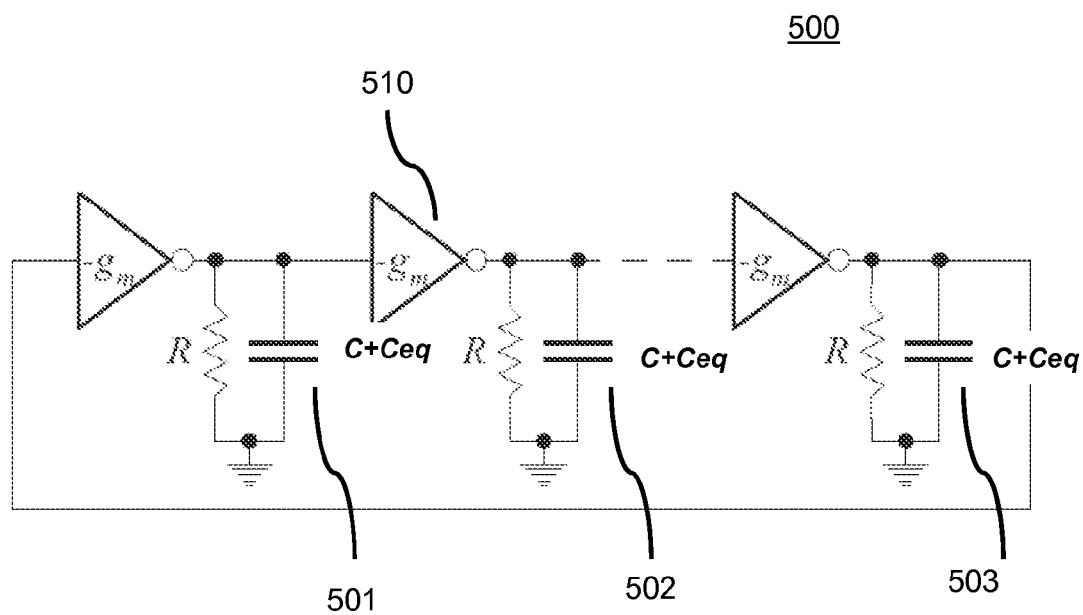
FIG. 5 shows an example of a device having a ring oscillator and a capacitive arrangement.

FIG. 5 shows an example of a a ring oscillator using the capacitive arrangement. In the oscillator 500 three amplifying sections (marked−$g_m$) 510 are coupled in a ring. The three outputs are loaded by respective intrinsic resistors R and capacitive arrangements 501, 502, 503. Each capacitive arrangement may be constituted by the intrinsic capacitance of −gm stage, marked C, in parallel with the single ended arrangement, Ceq, as shown in FIG. 1.

In the ring oscillator the capacitive arrangement is applied to control, program or tune the output frequency (fosc) with a very high resolution based on the very low capacitance step provided by the capacitive divider. fosc dependents on the delay (td) of N cascaded stages:

$$f_{OSC} = \frac{1}{2 \cdot N \cdot t_d}$$

The delay is defined as the change in output voltage at the midpoint of the transition, $V_{SW}$, divided by the slew rate, $I_{ss}/C$, resulting in a delay per stage of $C^*V_{SW}/I_{ss}$. C is here the intrinsic capacitance at input. The output frequency is:

$$f_{OSC} = \frac{I_{SS}}{2 \cdot N \cdot V_{SW} \cdot C}$$

By applying the capacitive arrangement 100 the output frequency becomes:

$$f'_{OSC} = \frac{I_{SS}}{2 \cdot N \cdot V_{SW} \cdot (C + Ceq)}$$

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Furthermore, the units and circuits may be suitably combined in one or more semiconductor devices.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electronic device comprising a capacitive arrangement for controlling a frequency characteristic of a circuit by modifying the equivalent capacitance of the capacitive arrangement in steps, the capacitive arrangement comprising
a varactor bank coupled to an input terminal of the capacitive arrangement, the varactor bank having a number of parallel coupled varactors and a control input for modifying the equivalent capacitance of the varactor bank by switching the respective varactors of the varactor bank on or off; and
a varactor arrangement coupled in parallel to the varactor bank, the varactor arrangement comprising a main varactor bank of N varactors and a series varactor bank of A varactors, N and A being integers, the main varactor bank connected in series with the series varactor bank for providing, when a varactor is switched in the main varactor bank, a capacitance step of a size $C_N$, the size $C_N$ being smaller than a size of a capacitance step when switching a single varactor of the varactor bank on or off.

2. The device as claimed in claim 1, wherein the capacitive arrangement comprises a shunt varactor bank of B varactors, B being an integer, the shunt varactor bank having one terminal coupled to a ground reference and the other terminal connected between the main varactor bank and the series varactor bank, said size $C_N$ being further programmable by switching at least one varactor in the shunt varactor bank.

3. The device as claimed in claim 1, wherein the capacitive arrangement comprises a further series varactor bank of AA varactors, AA being an integer, connected in series with the main varactor bank, said size $C_N$ being further programmable by switching at least one varactor in the further series varactor bank.

4. The device as claimed in claim 3, wherein the capacitive arrangement comprises a further shunt varactor bank of BB varactors, BB being an integer, the further shunt varactor bank having one terminal coupled to ground and the other terminal connected between the main varactor bank and the further series varactor bank, said size $C_N$ being further programmable by switching at least one varactor in the further shunt varactor bank.

5. The device as claimed in claim 3, wherein A and AA are equal and the control input of the series varactor bank and the control input of the further series varactor bank are configured to simultaneously control the series varactor bank and the further series varactor bank.

6. The device as claimed in claim 5, wherein B and BB are equal and the control input of the shunt varactor bank and the control input of the further shunt varactor bank are configured to simultaneously control the shunt varactor bank and the further shunt varactor bank.

7. The device as claimed in claim 1, wherein the varactors of the series varactor bank are grouped in at least one group $G_A$ of varactors, and a control input of the series varactor bank comprises at least one group control input for controlling the group $G_A$.

8. The device as claimed in claim 2, wherein the varactors of the shunt varactor bank are grouped in at least one group $G_B$ of varactors, and a control input of the shunt varactor bank comprises at least one group control input for controlling the group $G_B$.

9. The device as claimed in claim 1, wherein the device comprises a digitally controlled oscillator coupled to the capacitive arrangement for controlling the frequency.

10. The device as claimed in claim 9, wherein the device comprises a phase locked loop having an output coupled to the control input of the capacitive arrangement for constituting a digital frequency synthesizer.

11. The device as claimed in claim 9, wherein the digitally controlled oscillator is a ring oscillator comprising at least one delay stage, the stage being coupled to the capacitive arrangement for adapting or tuning the oscillation frequency.

12. The device as claimed in claim 9, wherein the device comprises a control circuit for controlling a frequency of the digitally controlled oscillator between a first frequency and a second frequency according to a required modulation waveform by adapting an equivalent capacitance of the capacitive arrangement via control inputs of the varactor bank and the varactor arrangement.

13. The device as claimed in claim 1, wherein a control input of the series varactor bank comprises a single control input for switching all varactors of the series varactor bank.

14. The device as claimed in claim 2, wherein a control input of the shunt varactor bank comprises a set of W control inputs for switching W groups of varactors of the shunt varactor bank.

15. A method of controlling a frequency characteristic of a circuit by modifying an equivalent capacitance of a capacitive arrangement in steps, the capacitive arrangement including a varactor bank to an input terminal of the capacitive arrangement, the varactor bank having a number of parallel coupled varactors, and a control input for modifying the equivalent capacitance of the varactor bank by switching the respective varactors of the varactor bank on or off, and a varactor arrangement coupled in parallel to the varactor bank, the varactor arrangement comprising a main varactor bank of N varactors and a series varactor bank of A varactors, N and A being integers, the main varactor bank connected in series with the series varactor bank and configured to, when a varactor is switched in the main varactor bank, provide a capacitance step of a size $C_N$, the size $C_N$ being smaller than a size of a capacitance step when switching a single varactor of the varactor bank on or off, the method comprising:
 programming the size $C_N$ by switching at least one varactor in the series varactor bank, and
 modifying the equivalent capacitance by switching the respective varactors on or off.

16. The method as claimed in claim 15, wherein the capacitive arrangement includes a shunt varactor bank of B varactors, B being an integer, the shunt varactor bank having one terminal coupled to a ground reference and the other terminal connected between the main varactor bank and the series varactor bank, the method further comprising:
 programming the size $C_N$ by switching at least one varactor in the shunt varactor bank.

17. A method comprising:
 providing a varactor bank coupled to an input terminal of the capacitive arrangement, the varactor bank having a number of parallel coupled varactors;
 controlling, by a control input of the varactor bank, an equivalent capacitance of the varactor bank, wherein the control input of the varactor bank switches the respective varactors of the varactor bank on or off;
 providing a varactor arrangement coupled in parallel with the varactor bank, the varactor arrangement including a main varactor bank of N varactors coupled in series with a series varactor bank of A varactors, N and A being integers;
 controlling, by a control input of the varactor arrangement, an equivalent capacitance of the varactor arrangement, wherein the control input of the varactor arrangement switches the respective varactors of the main varactor bank on or off, wherein switching a particular varactor of the N varactors provides a capacitance step of a size $C_N$, the size $C_N$ being smaller than a size of a capacitance step when switching a single varactor of the varactor bank on or off.

18. The method of claim 16, wherein the varactor arrangement further includes a shunt varactor bank of B varactors, B being an integer, and wherein the control input of the varactor arrangement further switches the respective varactors of the shunt varactor bank on or off, the method further comprising:
 programming the size of $C_N$ by switching a varactor in the shunt varactor bank on or off.

19. The method of claim 16, wherein the varactor arrangement further comprises another series varactor bank of AA varactors, AA being an integer, and wherein the control input of the varactor arrangement further switches the respective varactors of the other series varactor bank on or off, the method further comprising:
 programming the size of $C_N$ by switching a varactor in the other series varactor bank on or off.

20. The method of claim 19, wherein A and AA are equal and the control input of the varactor arrangement is configured to simultaneously control the series varactor bank and the other series varactor bank.

* * * * *